(12) United States Patent
Bai et al.

(10) Patent No.: US 9,678,178 B2
(45) Date of Patent: Jun. 13, 2017

(54) MAGNETORESISTIVE MAGNETIC FIELD GRADIENT SENSOR

(71) Applicant: Multidimension Technology Co., Ltd., Zhangjiagang (CN)

(72) Inventors: Jianmin Bai, Zhangjiagang (CN); James Geza Deak, Zhangjiagang (CN); Mingfeng Liu, Zhangjiagang (CN); Weifeng Shen, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 275 days.

(21) Appl. No.: 14/384,666

(22) PCT Filed: Jan. 29, 2013

(86) PCT No.: PCT/CN2013/071090
§ 371 (c)(1),
(2) Date: Sep. 11, 2014

(87) PCT Pub. No.: WO2013/135117
PCT Pub. Date: Sep. 19, 2013

(65) Prior Publication Data
US 2015/0130455 A1 May 14, 2015

(30) Foreign Application Priority Data
Mar. 14, 2012 (CN) .......................... 2012 1 0065925

(51) Int. Cl.
*G01B 7/14* (2006.01)
*G01R 33/09* (2006.01)
(Continued)

(52) U.S. Cl.
CPC ........... *G01R 33/098* (2013.01); *G01R 17/00* (2013.01); *G01R 33/022* (2013.01); *G01R 33/09* (2013.01); *G01R 33/093* (2013.01)

(58) Field of Classification Search
CPC ...... G01D 5/145; G01D 5/147; G01D 5/2013; G01R 33/09; G01R 33/093; G01B 7/003; G01B 7/30; G01B 7/312; G01B 7/14
See application file for complete search history.

(56) References Cited

U.S. PATENT DOCUMENTS 7,390,584 B2 * 6/2008 Daughton .............. B82Y 25/00
360/324.12
2004/0046549 A1 * 3/2004 Van Ostrand .......... G01R 33/09
324/207.21

(Continued)

FOREIGN PATENT DOCUMENTS

| CN | 102226835 A | 10/2011 |
|---|---|---|
| CN | 102298124 A | 12/2011 |

(Continued)

OTHER PUBLICATIONS

"International Application Serial No. PCT/CN2013/071090, International Search Report on Patentability dated Sep. 16, 2014", (w/ English Translation), 16 pgs.

(Continued)

*Primary Examiner* — Thang Le
(74) *Attorney, Agent, or Firm* — Schwegman Lundberg & Woessner, P.A.

(57) ABSTRACT

Disclosed is a magnetoresistive magnetic field gradient sensor, comprising a substrate, a magnetoresistive bridge and a permanent magnet respectively disposed on the substrate; the magnetoresistive bridge comprises two or more magnetoresistive arms; each magnetoresistive arm consists of one or more magnetoresistive elements; each magnetoresistive element is provided with a magnetic pinning layer; the magnetic pinning layers of all the magnetoresistive elements have the same magnetic moment direction; the permanent magnet is disposed adjacent to each magnetoresistive arm to provide a bias field, and to zero the offset of (Continued)

the response curve of the magnetoresistive element; the magnetoresistive gradiometer includes wire bonding pads that can be electrically interconnected using wire bonding to an ASIC or to the lead frame of a semiconductor chip package.

17 Claims, 6 Drawing Sheets

(51) Int. Cl.
*G01R 33/022* (2006.01)
*G01R 17/00* (2006.01)

(56) References Cited

U.S. PATENT DOCUMENTS

| | | | | |
|---|---|---|---|---|
| 2004/0212360 | A1* | 10/2004 | Sato | B82Y 25/00 324/200 |
| 2006/0291106 | A1* | 12/2006 | Shoji | G01R 33/09 360/324.11 |
| 2008/0012558 | A1* | 1/2008 | Rossler | B82Y 25/00 324/252 |
| 2008/0272771 | A1 | 11/2008 | Guo et al. | |
| 2008/0274270 | A1* | 11/2008 | Wakui | B82Y 25/00 427/128 |
| 2009/0015252 | A1* | 1/2009 | Raberg | B82Y 25/00 324/252 |
| 2009/0051353 | A1* | 2/2009 | Takeya | B82Y 25/00 324/207.21 |
| 2010/0253330 | A1* | 10/2010 | Sasaki | B82Y 25/00 324/252 |
| 2013/0334634 | A1 | 12/2013 | Deak et al. | |
| 2013/0335073 | A1 | 12/2013 | Deak et al. | |

FOREIGN PATENT DOCUMENTS

| | | |
|---|---|---|
| CN | 202119391 U | 1/2012 |
| CN | 102565727 A | 7/2012 |
| CN | 102590768 A | 7/2012 |
| CN | 202794487 U | 3/2013 |
| JP | 2007003498 | 1/2007 |
| JP | 2008277834 | 11/2008 |
| JP | 2009527758 | 7/2009 |
| JP | 2011101026 | 5/2011 |
| WO | WO-2013/135117 A1 | 9/2013 |

OTHER PUBLICATIONS

"International Application Serial No. PCT/CN2013/071090, International Search Report mailed Apr. 25, 2013", (w/ English Translation), 7 pgs.
"International Application Serial No. PCT/CN2013/071090, Written Opinion mailed Apr. 25, 2013", (w/ English Translation), 14 pgs.
"European Application No. 13761465.7, Extended European Search Report dated Dec. 22, 2015", (Dec. 22, 2015), 10 pgs.

* cited by examiner

MAGNETORESISTIVE MAGNETIC FIELD GRADIENT SENSOR

CROSS-REFERENCE TO A RELATED APPLICATION

This application is a 35 U.S.C. §371 national phase application of PCT/CN2013/071090, filed on Jan. 29, 2013, which claims a priority to a Chinese Patent Application No. CN 20120065925.5, filed on Mar. 14, 2012, incorporated herein by reference in its entirety.

TECHNICAL FIELD

The present invention relates to magnetoresistive magnetic field gradient sensors, in particular the use of magnetic tunnel junction magnetoresistive sensor elements to form a magnetoresistive magnetic field gradient sensor.

BACKGROUND ART

Magnetic field sensors are commonly used in modern systems to measure the magnetic field, current, position, direction, and many other physical parameters. In the prior art, there are many different types of sensors for measuring magnetic field, and these commonly use the Hall Effect, an anisotropic magnetoresistance (AMR), or giant magnetoresistance (GMR) elements.

Hall Effect sensors generally have low sensitivity, and thus often use a flux concentrator to increase the sensitivity. Flux concentrators increase the size and weight of the sensor, and can decrease the linearity of the sensor. Moreover, Hall elements generally have high power consumption. Although AMR elements have much higher sensitivity than Hall elements, they suffer from narrow linear range, and they need to be reset using a set/reset coil. The reset operation, resulting increases the complexity of the manufacturing process; the coil increases the size of the sensor; and, the power consumption also increased by the reset operation. Multilayer GMR sensor elements have higher sensitivity than AMR, but their linear range is low, and unless they are biased by a permanent magnet, the response curve of the can only provide a unipolar measurement of the magnetic field gradient, a bipolar magnetic field gradient cannot be measured.

Magnetic tunnel junction (MTJ) elements in recent years have been gaining acceptance as magnetoresistive sensors in industrial applications. They are multilayer devices that utilize of the tunnel magnetoresistance effect (TMR) for measuring the magnetic field, and these elements posses a larger rate of resistance change than AMR or GMR elements. Compared to the Hall Effect sensors, MTJ elements have superior temperature stability, higher sensitivity, lower power consumption, better linearity, and no need for flux concentrators; with respect to AMR sensors they have improved temperature stability, higher sensitivity, wider linear range, and no need for a set/reset coil structure; Compared to GMR sensors they have better temperature stability, higher sensitivity, lower power consumption, and wider linear range.

Although MTJ elements have high sensitivity, when used to detect weak field gradients the MTJ element can be disturbed by strong magnetic fields, and the high sensitivity MTJ elements are not easily amenable to low-cost mass production. The sensor yield depends on the offset value output from MTJ magnetoresistive element constituting the magnetoresistive bridge, because MTJ elements are often difficult to match on the different arms of the bridge. The manufacturing process for fully single-chip MTJ sensor bridges is very complicated.

SUMMARY OF THE INVENTION

In order to solve these problems, the present invention utilizes MTJ elements as the sensing elements in a magnetoresistive magnetic field gradiometer, which results in the advantages of high sensitivity, wide linear range, low power consumption, small volume, and good temperature performance.

To achieve the above object, the present invention discloses a magnetoresistive magnetic field gradient sensor comprising a magnetoresistive bridge, wherein the magnetoresistive bridge comprises a multiplicity of magnetoresistive arms that include one or more magnetoresistive element, wherein each magnetoresistive element within the magnetoresistive bridge has a magnetic pinning layer with a magnetic moment aligned in the same direction, a permanent magnet, wherein the permanent magnet is positioned adjacent to each of the magnetoresistive arms and generates a bias magnetic field to zero the offset of the transfer curve of the magnetoresistive element, a substrate on which the magnetoresistive bridge and the permanent magnets are deposited, a wire bond pad used to electrically interconnect magnetoresistive magnetic field gradiometer sensor to ASIC chip or to a terminal of a package lead frame by bond wires.

Preferably, the magnetoresistive element is a MTJ element.

Preferably, the magnetoresistive elements have shape anisotropy.

Preferably, the magnetoresistive elements are prepared using the same process on the same substrate and have the same shape and same resistance value.

Preferably, the magnetoresistive bridge is a half-bridge.

Preferably, magnetoresistive bridge is a full-bridge, wherein the magnetoresistive arms have the same sensing direction, the arms opposite to each other in the circuit diagram are in the same spatial location on the substrate and the arms adjacent to each other in the circuit diagram are in different spatial locations on the substrate, such that the magnetoresistive bridge detects a gradient magnetic field.

Preferably, the magnitude of the magnetization and direction of the of the permanent magnet are adjusted in order to control the output performance of the magnetoresistive magnetic field gradiometer.

Preferably, the magnitude of the magnetization and direction of the of the permanent magnet are adjusted in order to control the output performance of the magnetoresistive magnetic field gradiometer.

Adopting the above described features, the present invention will have good external DC magnetic field insensitivity, high gradient sensitivity, wide linear operating range, low power dissipation, small size, and good thermal performance.

FIGURES

PREFERRED EMBODIMENTS

Figure 1:
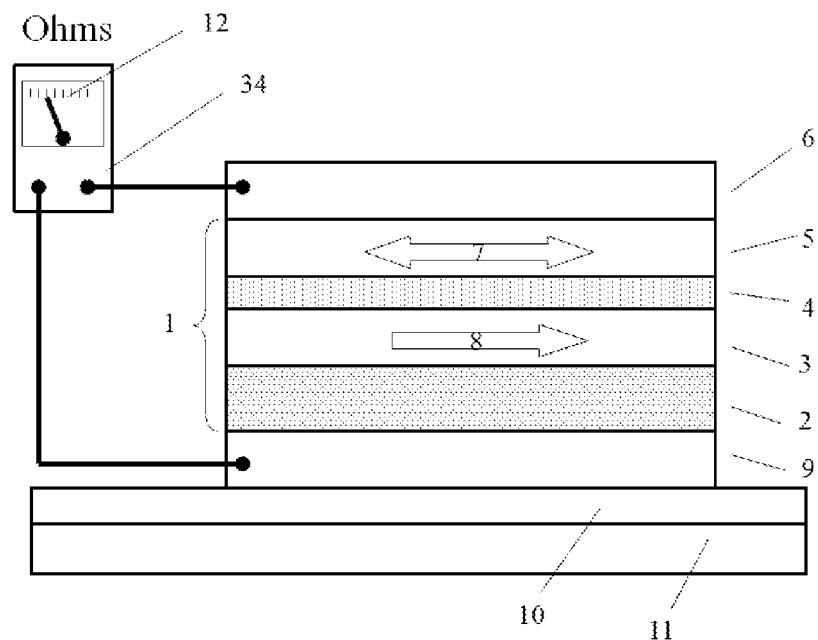
FIG. 1 is a schematic view of a MTJ magnetoresistive element.

FIG. 1 is a drawing that illustrates the function of the various layers in an MTJ element. A MTJ element 1 generally includes an upper layer of a ferromagnetic or synthetic antiferromagnetic (SAF) 5, a lower ferromagnetic SAF layer 3, and a tunnel barrier 4 between the two ferromagnetic layers. In this configuration, the upper ferromagnetic (SAF layer) constitutes the magnetic free layer 5, in which the magnetic moment is free to change direction in response to the external magnetic field 7. The lower ferromagnetic (SAF layer) 3 is a fixed magnetic layer, because of its magnetic moment direction 8 is rigidly fixed in one direction, so under normal conditions will not change. Usually the rigidly fixed ferromagnetic layer (SAF layer) 3 is called the pinned layer. The pinned layer is usually adjacent to an antiferromagnetic layer 2. The MTJ stack is usually deposited on top of an electrically conductive bottom electrode layer 9, and the MTJ structure is often capped with a conducting top electrode layer 6. The value of the resistance 12 measured between the top 6 and bottom 9 electrode layers of the MTJ is representative relative orientation of magnetic moments of the free layer 5 and the pinned layer 3. When the magnetization direction 5 of freelayer 7 and the magnetization direction 3 of pinned layer 8 are parallel the resistance 12 of the resistance of the MTJ element 1 is low. When the magnetization direction 7 of freelayer 5 and the magnetization direction 8 of pinned layer 3 are antiparallel the resistance 12 of the MTJ element 1 is high. By known techniques, the resistance of the MTJ element 1 may be made to vary linearly between the high resistance state and the low resistance state as the external magnetic field is varied.

The bottom electrode layer 9 and the top electrode layer 6 are in direct electrical contact respectively with the free layer 5 and antiferromagnetic layer 2. The electrode layers are generally composed of non-magnetic conductive materials capable of carrying current to the ohmmeter 34. Ohm meter 34 applies a known current (voltage) through the entire tunnel junction, and a voltage (or current) is measured. Typically, the tunnel barrier layer 4 provides most of the resistance of the device, on the order of about 1000 ohms and the resistance of all other conductors is about 10 ohms. The bottom electrode layer 9 is deposited on top of the insulating layer 10, which is in turn deposited on substrate 11, and insulating layer 10 is thicker than electrode layer 9, and they are composed of different materials. The substrate material is typically silicon, quartz, heat-resistant glass, GaAs, AlTiC or any other material capable of being provided as a smooth wafer. Because of the ease of processing integrated circuits (although such magnetic sensors may not always need circuitry) silicon is usually the best choice.

Figure 2:
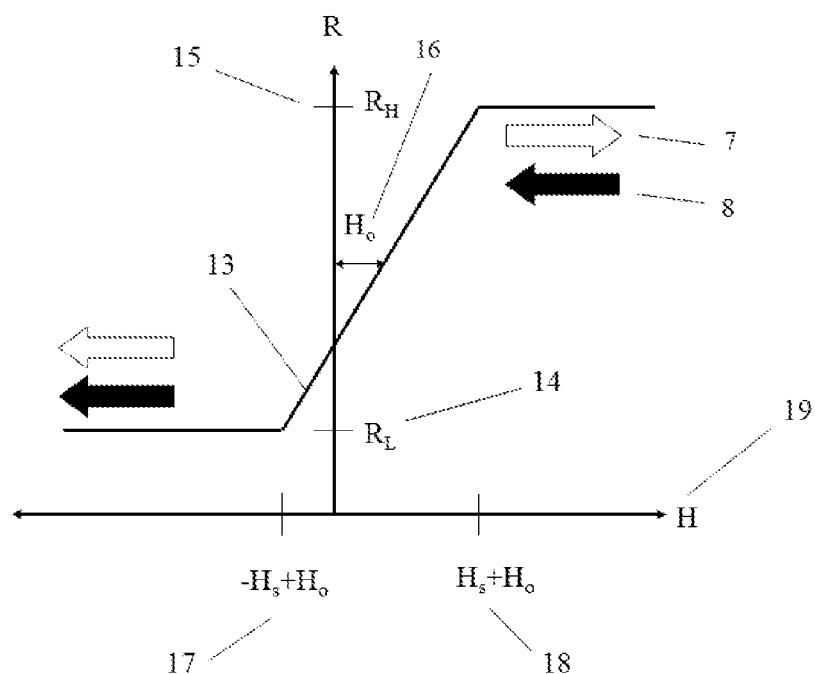
FIG. 2 illustrates the linear response of a MTJ magnetoresistive element.

FIG. 2 shows the linear response of a GMR or MTJ magnetoresistive element. When saturated, the output curve 13 will be in either the low resistance 14 $R_L$ or the high resistance 15 $R_H$ state. Response curve 13 in the area between the saturation fields varies linearly with the external magnetic field 19 (H). The external magnetic field 19 is applied parallel to the sensing axis 23. When the pinned layer 3 magnetization 8 is oriented antiparallel sensitive axis 23, the magnetic field is negative (−H). When the magnetization direction 8 of the pinned layer 3 is parallel to the magnetization direction 7 of the free layer 5, the transfer curve 13 is a low-resistance state; when the magnetization direction 8 of the pinned layer 3 is anti-parallel to the magnetization direction 7 of the free layer 5, the transfer curve 13 is in a high-resistance state. In between, the output curve 13 is linearly dependent on the relative magnetization angle of pinned layer 3 and free layer 5. The output curve 3 is usually not symmetric about H=0. Typically the saturation fields 17 and 18 are offset with respect to the H=0 point 16, such that the low-resistance state $R_L$ saturation point is closer to H=0. The offset value is often referred to as "orange peel coupling" or "Neel coupling," the typical value of this offset is usually between 1 and 40 Oe. It depends on the roughness of the MTJ element, making it dependent on materials and manufacturing processes.

As shown in FIG. 2, between the saturated regions 17 and 18, the output curve equation can be approximated as:

$$R(H) = \frac{R_H - R_L}{2H_s}(H - H_o) + \frac{R_H + R_L}{2}, \tag{1}$$

Herein, $H_S$ is the saturation field. $H_S$ is defined as the intersection between the linear region and the positive and negative saturation values, where the position is asymmetric due to $H_o$.

FIG. 2 shows the ideal magnetoresistive response curve. In the ideal state, the magnetoresistance R changes perfectly linearly with respect to applied field H, and there is no hysteresis (in actuality, the magnetoresistance shows a lag phenomenon, which is referred to as hysteresis. The magnetoresistive response curve for a full loop, often the hysteresis of common magnetoresistive materials is small, such that the response curve can be practically regarded as a straight line). In real applications of magnetoresistive sensors, due to magnetic sensor design constraints and material defects, the transfer curve 13 will not be truly linear.

Figure 3:
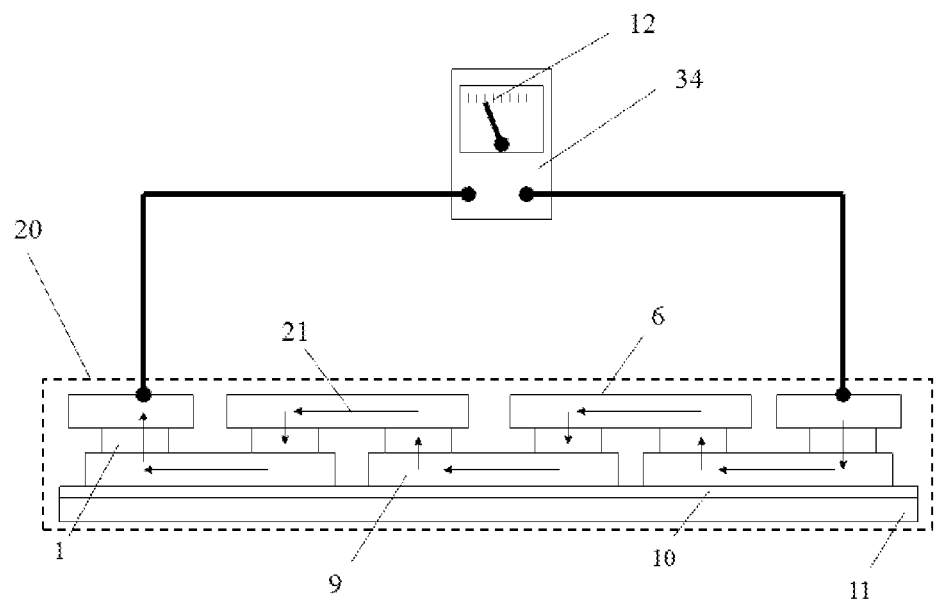
FIG. 3 illustrates a plurality of MTJ elements connected in series to form an equivalent MTJ magnetoresistive element 20.

As shown in FIG. 3, because of their small size, several MTJ elements 1 can be connected in series to form an equivalent MTJ magnetoresistor with increased sensitivity, with a reduction of 1/F noise (F is the number of MTJ elements 1 in seies), while improving the ESD performance. The more complicated MTJ element array 20 is used as a magnetoresistive arm. The MTJ element 1 sits between the bottom electrode 9 and the top electrode 6 in a sandwich structure, wherein the current flows perpendicularly through the MTJ element 21 and flows horizontally in the top electrode layer 6 and the bottom electrode layer 9. Bottom electrode 9 is on the top of insulating layer 10, and insulating layer 10 is on the top of the substrate 11. A wire bond pad sits at the end of each string of MTJ elements making up a magnetoresistive arm. This is where other magnetoresistive arms or where the ohmmeter 34 or other electrical circuit components may be connected. The direction of current flow through the MTJ magnetoresistive arm 20 does not affect the value of the magnetoresistance or the resistance. The value of the resistance can be changed by changing the number of MTJ elements 1 in the magnetoresistive arm 20.

A bridge circuit is often used to change the output resistance to a voltage than can be easily amplified. It can reduce the sensor noise, improve common mode rejection, reduce temperature drift and improve other deficiencies. The above mentioned MTJ arm 20 can be made into a bridge circuit.

Figure 4:
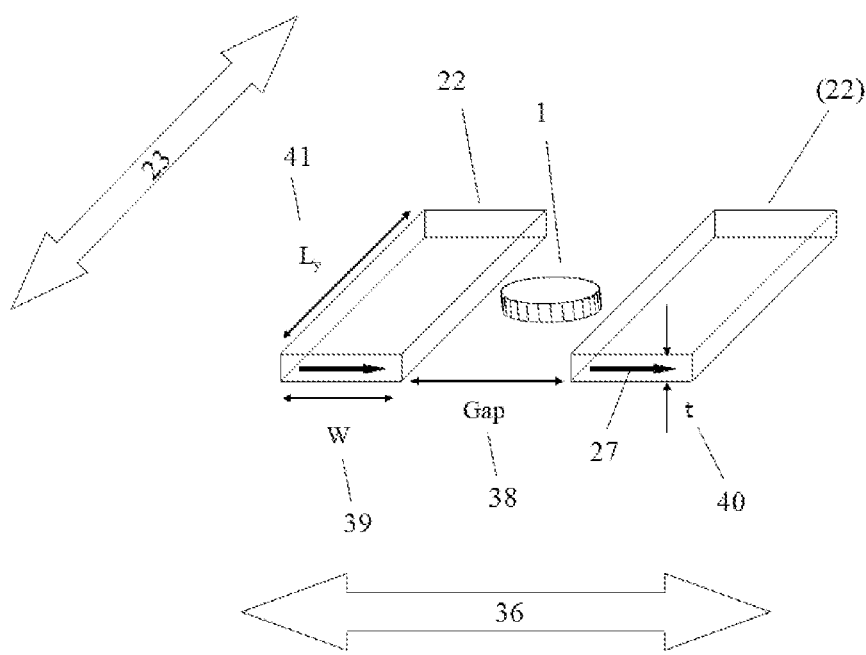
FIG. 4 illustrates the relative position of MTJ elements 1 and permanent magnets 22.
Figure 5:
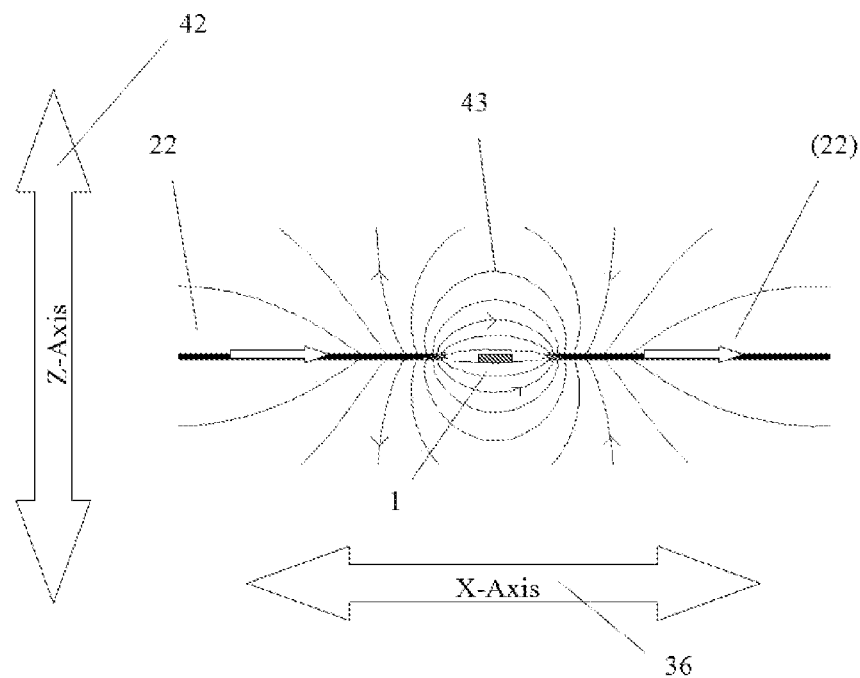
FIG. 5 is a cross-sectional view a MTJ element 1 and the permanent magnet 22 as shown in shown in FIG. 4, showing the flux distribution of the magnetic field.

As shown in FIG. 4, an MTJ element 1 is placed between two permanent magnets 22. Permanent magnets 22 have a gap 38 (Gap) between them, a width (W) 39, a thickness (t) 40 and length ($L_y$) 41. Permanent magnet 22 is designed to provide a cross-bias field ($H_{cross}$) 27 perpendicular to the sensitive axis 23 of the gradiometer. The magnetization of the permanent magnets 22 can be set by applying a large magnetic field, and the resulting field distribution 43 of the permanent magnets 22 is shown in FIG. 5.

Figure 6:
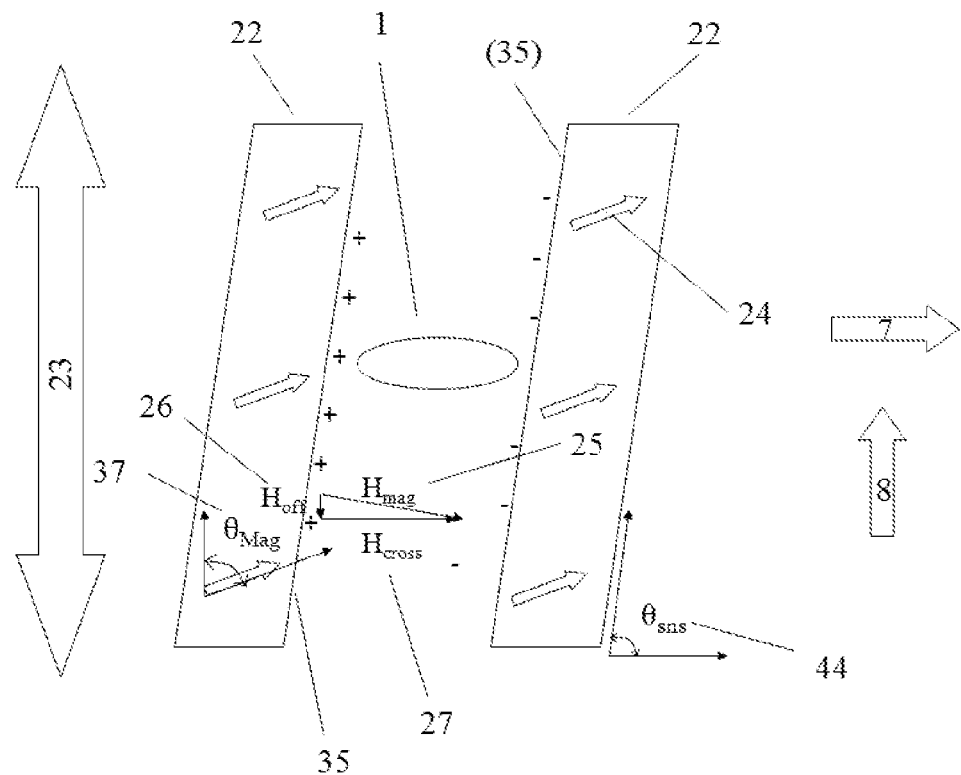
FIG. 6 is a schematic view of the permanent magnet 22 and the various angles 23 relative to the sensing direction used to control the MTJ element offset and saturation field strength.

The magnetic field emanating from the edge 35 of the permanent magnets 22 is considered to arise from magnetic charges that form as a result of boundary conditions as shown schematically in FIG. 6. The amount of magnetic charge depends on the magnitude $M_r$ and direction $\theta_{mag}$ 37 of the magnetic moment, and the associated angle of orientation of the permanent magnets $\theta_{sns}$ 44 as:

$$\rho_s = M_r \sin(\theta_{sns} - \theta_{mag}) \tag{2}$$

Additionally, the magnetic field resulting from the distribution of magnetic charges can be defined as:

$$\vec{H}(\vec{r}) = 4\pi \int_{Surface} \frac{\rho_s}{(\vec{r} - \vec{r}')^2} dS' \tag{3}$$

When $\theta_{mag} = \theta_{ref} = \pi/2$, the magnetic field at MTJ element 1 only depends on remanent moment $M_R$ as described by the following equation:

$$H_{cross} = -8M_r \left( atan\left(\frac{L_y t}{\left(\frac{W}{2} - \frac{gap}{2}\right)\sqrt{L_y^2 t^2 \left(\frac{W}{2} - \frac{gap}{2}\right)^2}}\right) + \right. \tag{4}$$

$$\left. atan\left(\frac{L_y t}{\left(\frac{W}{2} + \frac{gap}{2}\right)\sqrt{L_y^2 t^2 \left(\frac{W}{2} + \frac{gap}{2}\right)^2}}\right) \right)$$

Equation 4 is a function of the width W 39 and gap G 38 shown in FIG. 4, so the saturation field of the MTJ element 1 can be changed by changing the dimensions of permanent magnets 22.

Along the direction perpendicular to the sensitive direction 23 of the MTJ element, permanent magnets 22 produce a bias field for the magnetoresistive element $$H_{off} = H_{mag} \cos(\theta_{sns}) \tag{5}$$

Parallel to the sensitive direction 23 of the MTJ element, the magnetic field of the permanent magnet 22 is $$H_{off} = H_{mag} \sin(\theta_{sns}) \tag{6}$$

As can be seen from above, by adjusting the thickness of the permanent magnet, the angles of the permanent magnet $\theta_{mag}$ 37 and $\theta_{sns}$ 44, it is possible to change $H_{off}$, in order to compensate the MTJ element against the Neel coupling field $H_0$, thereby modifying the output characteristics and improving performance. On the other hand, it is also possible to adjust $H_{cross}$, to change the saturation field of the MTJ element, thereby adjusting the sensitivity.

By setting the permanent magnets 22 at an angle $\theta_{sns}$ 44 with respect to the sensing axis 23, it is possible to simultaneously produce $H_{cross}$ 27 and $H_{off}$ 26 fields, in order to set the MTJ element saturation field, at the same time cancel the Neel coupling, to center the response curve of the MTJ element around zero field; this method will optimize the symmetry of the output response of the bridge, reduce effective Neel coupling and set desired sensitivity. In addition, setting the remanent magnetization $M_r$ at angle $\theta_{mag}$ 37 with respect to the sensing axis 23 after preparation of the gradiometer chip, permits fine tuning of the device to optimize symmetry, allowing further improvement in manufacturing yield.

MTJ element 1 is generally patterned into a shape in order to provide shape anisotropy $H_k$. The common shapes are long ellipse, long rectangle, rhomboid, etc. With regard to this, the MTJ element 1 will have a saturation field $H_S$ given by:

$$H_S = H_k + H_{cross}, \tag{7}$$

A single MTJ element magnetoresistive response curve 1 as herein described has a sensitivity of:

$$S_R = \frac{dR(H)}{dH} = \frac{R_H - R_L}{2H_S} = \frac{R_H - R_L}{2(H_k + H_{cross})}, \tag{8}$$

By changing the shape of the permanent magnets and the MTJ elements the response curve of the MTJ element can be modified.

Figure 7:
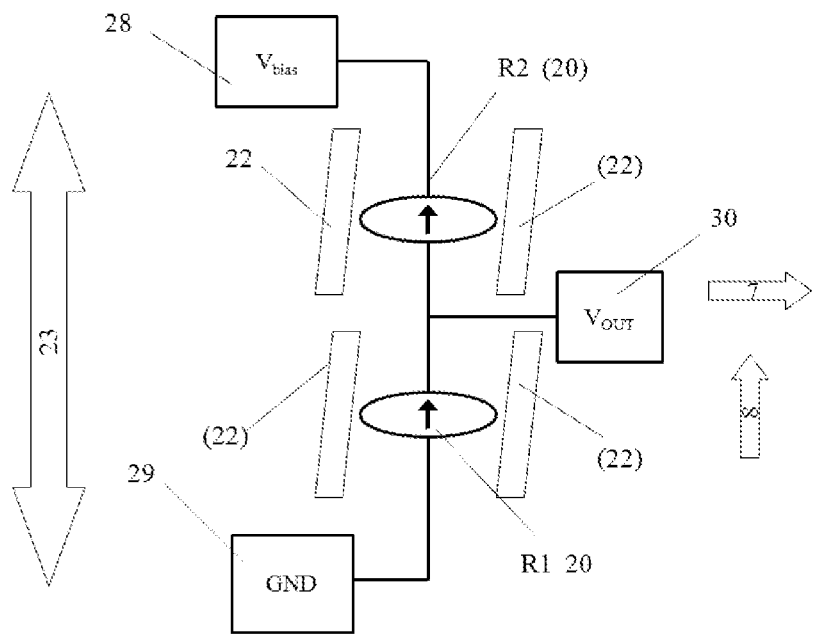
FIG. 7 is a schematic diagram of a half-bridge magnetic field gradiometer.

FIG. 7 schematically shows a half bridge gradiometer configuration. As shown in FIG. 7, two MTJ elements R1 and R2 have the same sensing direction, configured as a half bridge, the magnetoresistors are deposited on substrate 11 and insulating layer 10 which has electrical contacts, allowing for the formation of the gradiometer. There are many ways to connect to the bridge electrical contacts. These include the typical structure: integrated in-chip connections, wire-bonding, and solder-bumping. The permanent magnets 22 are tilted with respect to the MTJ elements 20, between the two wire bond pads 28 and 29 a constant bias voltage $V_{bias}$ is applied, a gradient in external magnetic field H along the sensing direction 23, causes a different magnetic field to be produced at MTJ elements R1 and R2 causing them to show different resistance values. Arrow 8 represents the magnetization direction of the pinning layers 3 of the MTJ elements 20, wire-bond pad 30 provides the gradiometer output $V_{OUT}$. When deposited on the same substrate MTJ elements 20 usually have about the same resistance, although it is not possible to guarantee a perfect match, there is often some slight difference between the two MTJ elements R1 and R2, such that we may define different effective magnetic fields H1 and H2, wherein H1 and H2 can be written:

$$H_1 = H_{CM} + H_{dM}, H_2 = H_{CM} - H_{dM}, \tag{9}$$

and $$H_{CM} = \frac{H_1 + H_2}{2}, H_{dM} = \frac{H_1 - H_2}{2}. \quad (10)$$

The fields $H_{CM}$ and $H_{dM}$ are the common mode and differential mode output field values.

Ideally, R1=R2, $S_{R1}=S_{R2}$, MTJ elements R1 and R2 are consistently the same, biased with half-bridge bias voltage $V_{bias}$, then for a common mode magnetic field $H_{CM}$, the half-bridge output voltage is $V_{OUT}$30:

$$V_1 = \frac{R_2 + S_{R2}H_{CM}}{R_1 + S_{R1}H_{CM} + R_2 + S_{R2}H_{CM}} V_{bias} = \frac{1}{2}V_{bias}, \quad (11)$$

Setting $V_{bias}$=1V results in a common mode sensitivity of $S_{CM}$=$dV_1/dH_{CM}$=0

The output does not change with $H_{CM}$, it is only sensitive to the external magnetic field gradient, and this makes it insensitive to external magnetic field interference.

For the differential mode $H_{dM}$, we can write:

$$V_{OUT} = \left(\frac{R2 - S_{R2}H_{dM}}{R1 + S_{R1}H_{dM} + R_2 - S_{R2}H_{dM}} - \frac{R2}{R1 + R2}\right)V_{bias}, \quad (12)$$

Ideally, $S_{R1}=S_{R2}$, R1=R2 such that:

$$V_{OUT} = -\frac{S_{R2}H_{dM}}{2_{R2}}V_{bias}, \quad (13)$$

So it can be observed that the gradiometer output change in response to a differential mode field $H_{dM}$ changes, when biased $V_{bias}$=1V, the sensitivity is $$S_{CM} = \frac{dV_{OUT}}{dH_{dM}} = \frac{S_{R2}}{2R_2}, \quad (14)$$

Figure 8:
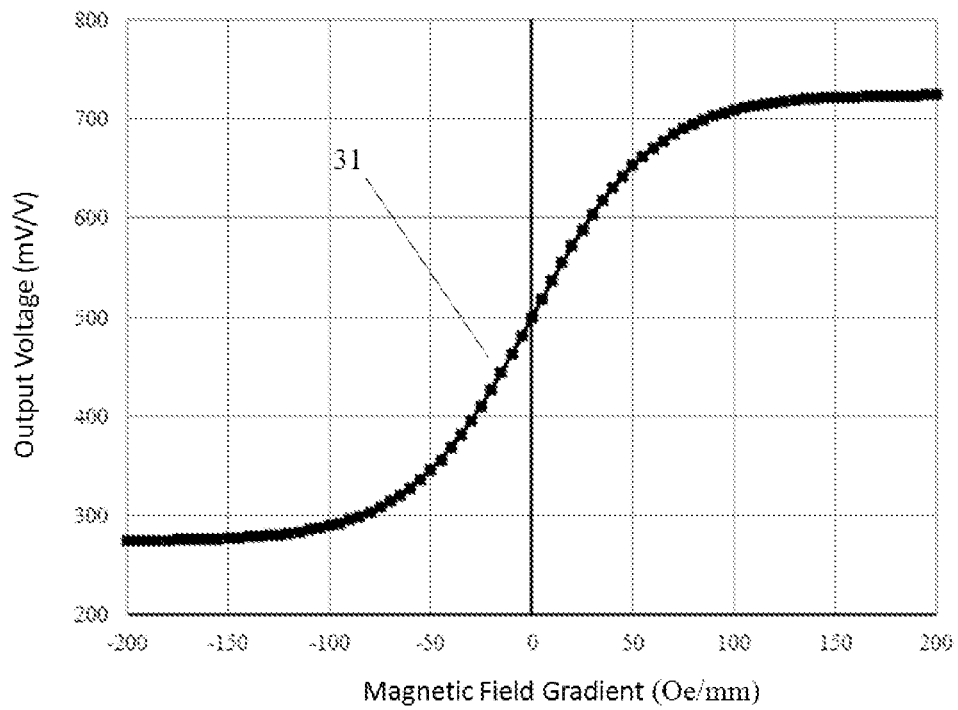
FIG. 8 illustrates the output response of a half-bridge magnetic field gradiometer sensor.

As can be seen from the above equation, the half-bridge gradiometer in differential mode only responds to a gradient magnetic field, and outputs a signal proportional to it, but also has good magnetic field anti-interference capability. The measurement results of a typical half-bridge gradiometer are shown in FIG. 8. Unlike the case of an ordinary half-bridge, the horizontal axis represents the gradient magnetic field. Because they are located at different locations, and the applied magnetic field has a gradient, the strength of the magnetic fields H1 and H2 at resistors R1 and R2 is different.

Small differences in R1 and R2, make small differences in sensitivities $S_{R1}$ and $S_{R2}$, and this causes a response to a common mode magnetic field $H_{CM}$. Still, the common mode sensitivity is much smaller than the differential mode sensitivity, and the sensitivity to the undesired common mode response can be quantified as a common mode rejection ratio CMRR:

$$CMRR = 20\log\frac{S_{CM}}{S_{dM}}, \quad (15)$$

With good process capability, CMRR is better than 40 dB.

Figure 9:
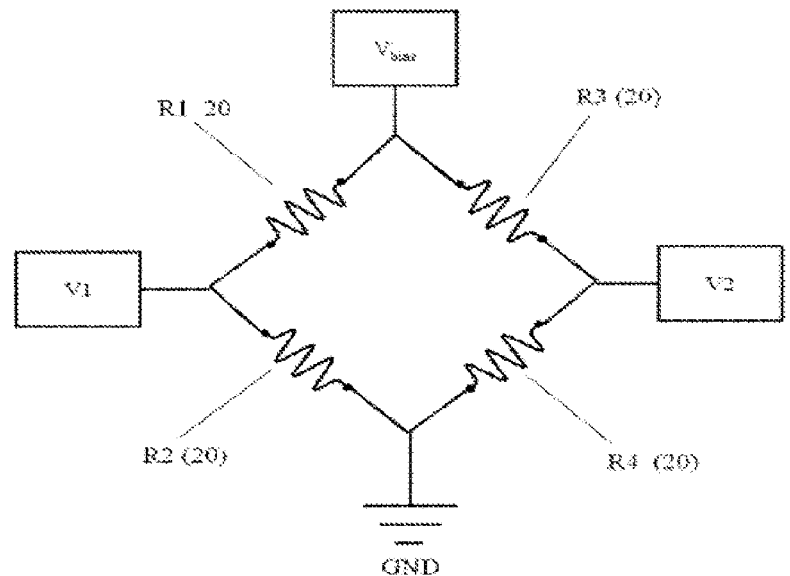
FIG. 9 shows the circuit diagram of a full-bridge magnetic field gradiometer sensor.
Figure 10:
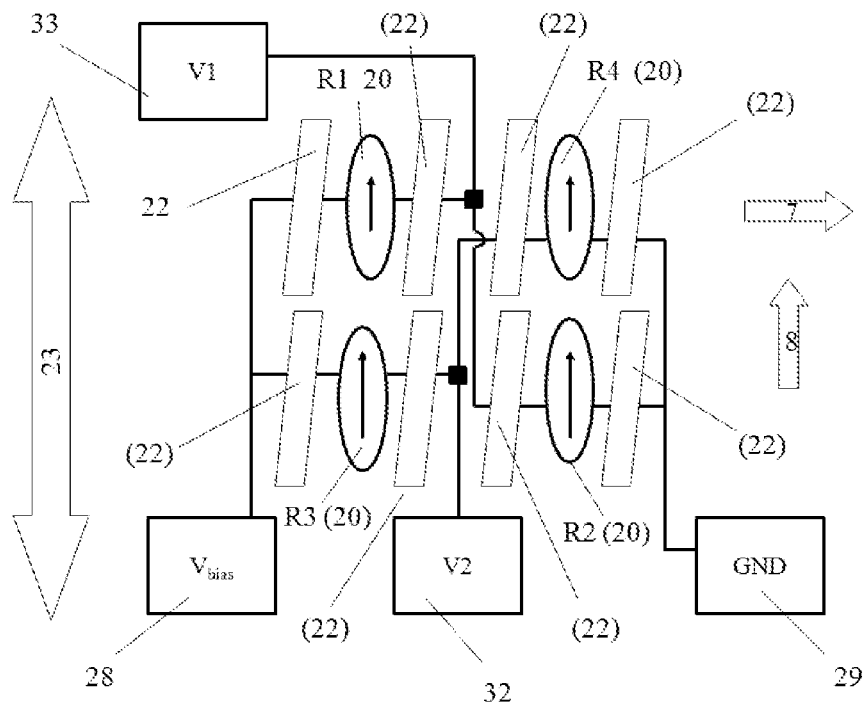
FIG. 10 is a schematic diagram of a full-bridge magnetic field gradiometer.

FIG. 9 shows the circuit diagram of a full-bridge magnetic field gradiometer, and FIG. 10 shows the physical layout of the full bridge MTJ magnetic field gradiometer. As shown in FIG. 9, each of the four magnetoresistive arms R1, R2, R3, R4 in the full bridge has the same sensitive direction. The magnetoresistors are deposited on the insulated substrate 10, 11 which is prepared with electrical contacts that can be used to electrically connect them. There are many ways to connect the bridge circuit to other components. Typical methods include: chip-scale methods, wire-bonding, and solder bumping. As shown in FIG. 10, in the full bridge structure R1 and R4 are in same physical location on the chip, R2 and R3 are in the same physical location on the chip, all magnetoresistive arms in the bridge have the same sensitive direction, permanent magnets 22 are tilted and set around the MTJ elements 20, a bias voltage $V_{bias}$ is applied between bond-pads 28 and 29, the gradient of the external magnetic field H is measured along the sensitive direction 23, along the field direction the different pairs of MTJ magnetoresistive elements R1 and R2 (R3 and R4) show a different resistance change, arrow 8 shows the pinned layer magnetization direction for all four MTJ elements 20, The output terminals of the device 32 and 33 are representative of the voltage difference (V2-V1) and are the $V_{OUT}$.

Ideally, the output $V_{OUT}$ only responds to the differential mode magnetic field $H_{dM}$. For the differential mode, the response can be written:

$$V_1 = -\frac{S_{R2} \cdot H_{dM}}{2R_2}V_{bias} = -\frac{S_R H_{dM}}{2R}V_{bias}, \quad (16)$$

$$V_2 = \left(\frac{R_4 + S_{R4}H_{dM}}{R_4 + S_{R4}H_{dM} + R_3 - S_{R3}H_{dM}} - \frac{R_4}{R_3 + R_4}\right)V_{bias} \Rightarrow \quad (17)$$

$$V_2 = \frac{S_{R4}H_{dM}}{R_3 + R_4}V_{bias} = \frac{S_R H_{dM}}{2R}Vbias,$$

Under ideal conditions, R1=R2=R3=R4, $S_{R1}=S_{R2}=S_{R3}=S_{R4}=S_R$, such that:

$$V_{OUT} = V_2 - V_1 = \frac{S_R H_{dM}}{R}V_{bias}, \quad (18)$$

Figure 11:
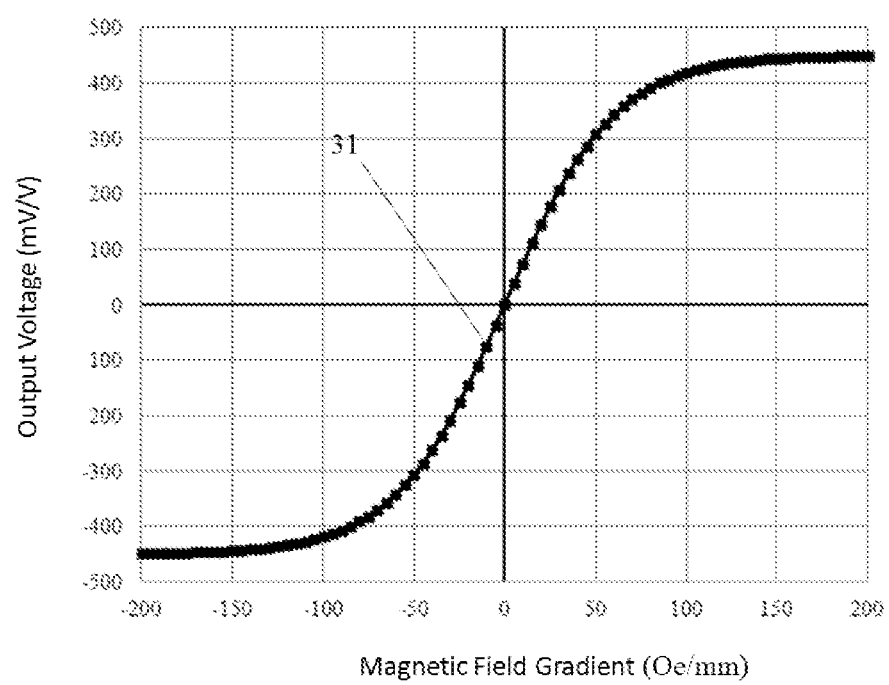
FIG. 11 illustrates the output response of a full-bridge magnetic field gradiometer sensor.

Wherein, R is the resistance value of the MTJ elements 20, and $S_R$ is the sensitivity of the magnetoresistive elements. It can be shown that the full and half bridge magnetic field gradiometers have the same insensitivity to common mode magnetic fields, but the full-bride has twice the sensitivity of the half-bridge magnetic field gradiometer. The typical output response of a full-bridge magnetic field gradiometer is shown in FIG. 11.

The above mentioned half and full-bridge gradiometers can be prepared on single substrate using the same process steps. For this reason they can be called single-chip magnetoresistive magnetic field gradiometers. They are compatible with various different packaging techniques and can also be made multi-chip. For example, the magnetoresistive elements can be prepared on the same substrate using the same process steps, but then diced into separate chips that are electrically connected, resulting in full or half-bridge gradiometer devices. Whether single or multi-chip packaging is used, the external bond pads of the bridges may or may not be connected to an ASIC both of which would be placed on a lead frame, electrically connected to the output pins of the lead frame, and then encapsulated to form the packaged device.

The above description describes several different specific implementations of the invention, obviously, many more variations can be implemented without departing from the scope or spirit of the invention. Those skilled in the art can make many variations without departing from the intent or technical scope of the invention.

The invention claimed is:

1. A magnetoresistive magnetic field gradiometer sensor, comprising a multiplicity of magnetoresistive arms connected to form a magnetoresistive bridge, wherein each of the multiplicity of the magnetoresistive arms includes one or more magnetoresistive elements, wherein the magnetoresistive elements for all of the magnetoresistive arms that form the magnetoresistive bridge have substantially equal transfer curves to provide substantially equal sensitivities to an applied magnetic field, wherein each of the magnetoresistive elements within the magnetoresistive bridge has a magnetic pinning layer with a magnetic moment aligned in the same direction, permanent magnets operatively positioned with respect to the magnetoresistive arms to generate a bias magnetic field to zero an offset of the transfer curve of each of the magnetoresistive elements, a semiconductor substrate on which the magnetoresistive bridge and the permanent magnets are deposited, a wire bond pad used to electrically interconnect the magnetoresistive magnetic field gradiometer sensor to an application-specific integrated circuit (ASIC) chip or to a terminal of a package lead frame by bond wires.

2. The magnetoresistive magnetic field gradiometer sensor of claim 1, wherein the magnetoresistive elements are magnetic tunnel junction (MTJ) elements.

3. The magnetoresistive magnetic field gradiometer sensor of claim 2, wherein the magnetoresistive elements have shape anisotropy.

4. The magnetoresistive magnetic field gradiometer sensor of claim 3, wherein the magnetoresistive elements are prepared using the same process on the same semiconductor substrate and have the same shape and the same resistance value.

5. The magnetoresistive magnetic field gradiometer sensor of claim 1, wherein the magnetoresistive bridge is a half-bridge.

6. The magnetoresistive magnetic field gradiometer sensor of claim 1, wherein the magnetoresistive bridge is a full-bridge, the magnetoresistive arms have the same sensing direction, and the magnetoresistive arms are distributed between two separated spatial locations on the semiconductor substrate, such that the magnetoresistive arms, connected in series, are not in the same spatial location on the semiconductor substrate as the magnetoresistive arms to which they are electrically connected, such that the magnetoresistive bridge detects the gradient of the applied magnetic field.

7. The magnetoresistive magnetic field gradiometer sensor of claim 1, wherein a magnitude of a magnetization of the permanent magnets is adjusted in order to control an output performance of the magnetoresistive magnetic field gradiometer.

8. The magnetoresistive magnetic field gradiometer sensor of claim 1, wherein the magnetoresistive magnetic field gradiometer is a single chip magnetoresistive magnetic field gradiometer.

9. The magnetoresistive magnetic field gradiometer sensor of claim 1, wherein an angle of a magnetization of the permanent magnets is adjusted in order to control an output performance of the magnetoresistive magnetic field gradiometer.

10. The magnetoresistive magnetic field gradiometer sensor of claim 1, wherein an angle of the permanent magnets is adjusted in order to control an output performance of the magneto resistive magnetic field gradiometer.

11. The magnetoresistive magnetic field gradiometer sensor of claim 1, wherein an angle of a magnetization of the permanent magnets is adjusted in order to control an output performance of the magnetoresistive magnetic field gradiometer.

12. The magnetoresistive magnetic field gradiometer sensor of claim 1, wherein an angle of the permanent magnets is adjusted in order to control an output performance of the magnetoresistive magnetic field gradiometer.

13. A magnetoresistive magnetic field gradiometer sensor to detect a gradient in an applied magnetic field, the sensor comprising:
a magnetoresistive bridge formed by connected magnetoresistive arms;
each of the magnetoresistive arms including at least one magnetoresistive element;
all of the magnetoresistive elements within the magnetoresistive bridge having a magnetic pinning layer with a magnetic moment aligned in the same direction, and having substantially equal transfer curves to provide substantially equal sensitivities to the applied magnetic field such that, when the gradient in the applied electric field causes different ones of the magnetoresistive elements to experience different magnetic fields, the different ones of the magnetoresistive elements have different resistance values;
permanent magnets operatively positioned to generate a bias magnetic field to zero an offset of the transfer curve of each of the magnetoresistive elements;
a substrate on which the magnetoresistive bridge and the permanent magnets are deposited; and
a wire bond pad on the substrate.

14. The magnetoresistive magnetic field gradiometer sensor of claim 13, wherein the magnetoresistive elements include magnetic tunnel junctions (MTJ) elements.

15. The magnetoresistive magnetic field gradiometer sensor of claim 13, wherein the bridge includes a full-bridge.

16. The magnetoresistive magnetic field gradiometer sensor of claim 13, wherein the bridge includes a half-bridge.

17. The magnetoresistive magnetic field gradiometer sensor of claim 13, wherein the magnetoresistive magnetic field gradiometer is a single chip magnetoresistive magnetic field gradiometer.

* * * * *

UNITED STATES PATENT AND TRADEMARK OFFICE
CERTIFICATE OF CORRECTION

PATENT NO. : 9,678,178 B2  
APPLICATION NO. : 14/384666  
DATED : June 13, 2017  
INVENTOR(S) : Bai et al.

Page 1 of 1

It is certified that error appears in the above-identified patent and that said Letters Patent is hereby corrected as shown below:

On the Title Page

Item (30), in "Foreign Application Priority Data", in Column 1, Line 1, delete "2012 1 0065925" and insert --20120065925.5-- therefor In Column 2, under "Other Publications", Line 2, delete "Search" and insert --Preliminary-- therefor Signed and Sealed this
Twenty-seventh Day of November, 2018

Andrei Iancu
*Director of the United States Patent and Trademark Office*